United States Patent
Patel et al.

(10) Patent No.: US 10,922,017 B2
(45) Date of Patent: Feb. 16, 2021

(54) MEMORIES FOR READING DATA CORRESPONDING TO MULTIPLE ADDRESSES ASSOCIATED WITH A READ COMMAND

(71) Applicant: MICRON TECHNOLOGY, INC., Boise, ID (US)

(72) Inventors: Vipul Patel, Santa Clara, CA (US); Theodore T. Pekny, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 120 days.

(21) Appl. No.: 16/056,870

(22) Filed: Aug. 7, 2018

(65) Prior Publication Data

US 2020/0050393 A1  Feb. 13, 2020

(51) Int. Cl.
*G06F 3/06*  (2006.01)
*G11C 16/04*  (2006.01)
*G11C 16/26*  (2006.01)
*G06F 12/02*  (2006.01)

(52) U.S. Cl.
CPC .......... *G06F 3/0659* (2013.01); *G06F 3/0604* (2013.01); *G06F 3/0679* (2013.01); *G06F 12/02* (2013.01); *G11C 16/0483* (2013.01); *G11C 16/26* (2013.01)

(58) Field of Classification Search
CPC .. G06F 3/0659; G06F 12/0246; G06F 3/0622; G06F 2212/7201; G06F 3/061; G06F 2212/7207; G06F 12/0802; G06F 2212/1044; G06F 2212/2022; G06F 3/0679; G06F 3/0604; G06F 12/02; G11C 16/0483; G11C 16/26; G11C 11/5642; G11C 7/04; G11C 7/1018
USPC .......................................................... 711/103
See application file for complete search history.

(56) References Cited

U.S. PATENT DOCUMENTS

| | | | |
|---|---|---|---|
| 9,070,470 B1 | 6/2015 | Sakui | |
| 9,430,417 B2 | 8/2016 | Tanzawa | |
| 9,502,125 B2 | 11/2016 | Moschiano et al. | |
| 2017/0271022 A1* | 9/2017 | Watanabe | G11C 16/26 |
| 2017/0309338 A1* | 10/2017 | Shah | G11C 16/26 |
| 2018/0081575 A1* | 3/2018 | Takada | G06F 11/1048 |
| 2018/0268891 A1* | 9/2018 | Li | G11C 11/4091 |
| 2018/0285198 A1* | 10/2018 | Dantkale | G06F 12/128 |

* cited by examiner

*Primary Examiner* — Hashem Farrokh

(74) *Attorney, Agent, or Firm* — Dicke, Billig & Czaja, PLLC

(57) ABSTRACT

Memories, and systems incorporating similar memories, as well as their operation, where the memory might include an array of memory cells, a status register, and a controller configured to access the array of memory cells. The controller may further be configured to perform a plurality of read operations on the array of memory cells in response to a read command associated with a plurality of addresses, store a particular value to the status register in response to data of a particular read operation corresponding to a particular address of the plurality of addresses being available for readout by an external device, and store a different value to the status register in response to data of a different read operation corresponding to a different address of the plurality of addresses being available for readout by the external device.

26 Claims, 10 Drawing Sheets

US 10,922,017 B2

MEMORIES FOR READING DATA CORRESPONDING TO MULTIPLE ADDRESSES ASSOCIATED WITH A READ COMMAND

TECHNICAL FIELD

The present disclosure relates generally to memory and, in particular, in one or more embodiments, the present disclosure relates to memories for reading data corresponding to multiple addresses associated with a read command, as well as their operation and incorporation into electronic systems.

BACKGROUND

Memories (e.g., memory devices) are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

As performance criteria for systems using memory become more demanding, a desire for faster access of memories may result.

DETAILED DESCRIPTION

Figure 1:
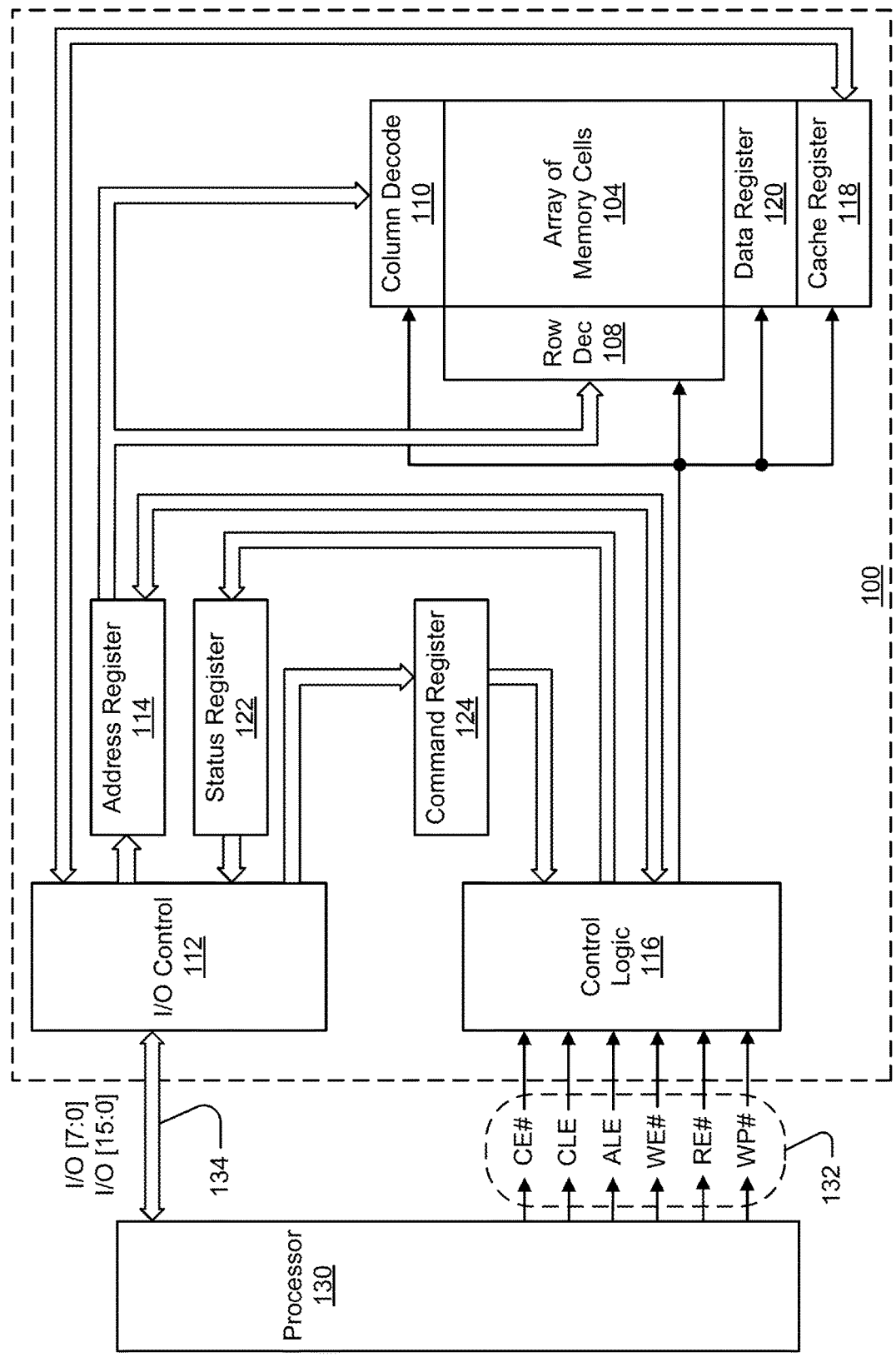
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions. The term conductive as used herein, as well as its various related forms, e.g., conduct, conductively, conducting, conduction, conductivity, etc., refers to electrically conductive unless otherwise apparent from the context. Similarly, the term connecting as used herein, as well as its various related forms, e.g., connect, connected, connection, etc., refers to electrically connecting unless otherwise apparent from the context.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, cellular telephones and the like. The processor 130, e.g., a controller external to the memory device 100, may be a memory controller or other external host device. The processor 130 may be configured to access the memory 100 in accordance with embodiments.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and generates status information for the external processor 130, i.e., control logic 116 is configured to perform access operations (e.g., read operations, programming operations and/or erase operations) in accordance with embodiments described herein. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data may be passed from the cache register 118 to the data register 120 for transfer to the array of memory cells 104; then new data may be latched in the cache register 118 from the I/O control circuitry 112. During a read operation, data may be passed from the cache register 118 to the I/O control circuitry 112 for output to the external processor 130; then new data may be passed from the data register 120 to the cache register 118. The cache register 118 and/or the data register 120 may form (e.g., may form a portion of) a page buffer of the memory device 100. A page buffer may further include sensing devices (not shown) to sense a data state of a memory cell of the array of memory cells 104. A status register 122 may be in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands may be received over input/output (I/O) pins [7:0] of I/O bus 134 at I/O control circuitry 112 and may then be written into command register 124. The addresses may be received over input/output (I/O) pins [7:0] of I/O bus 134 at I/O control circuitry 112 and may then be written into address register 114. The data may be received over input/output (I/O) pins [7:0] for an 8-bit device or input/output (I/O) pins [15:0] for a 16-bit device at I/O control circuitry 112 and then may be written into cache register 118. The data may be subsequently written into data register 120 for programming the array of memory cells 104. For another embodiment, cache register 118 may be omitted, and the data may be written directly into data register 120. Data may also be output over input/output (I/O) pins [7:0] for an 8-bit device or input/output (I/O) pins [15:0] for a 16-bit device.

It will be appreciated by those skilled in the art that additional circuitry and signals can be provided, and that the memory device 100 of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) may be used in the various embodiments.

Figure 2A:
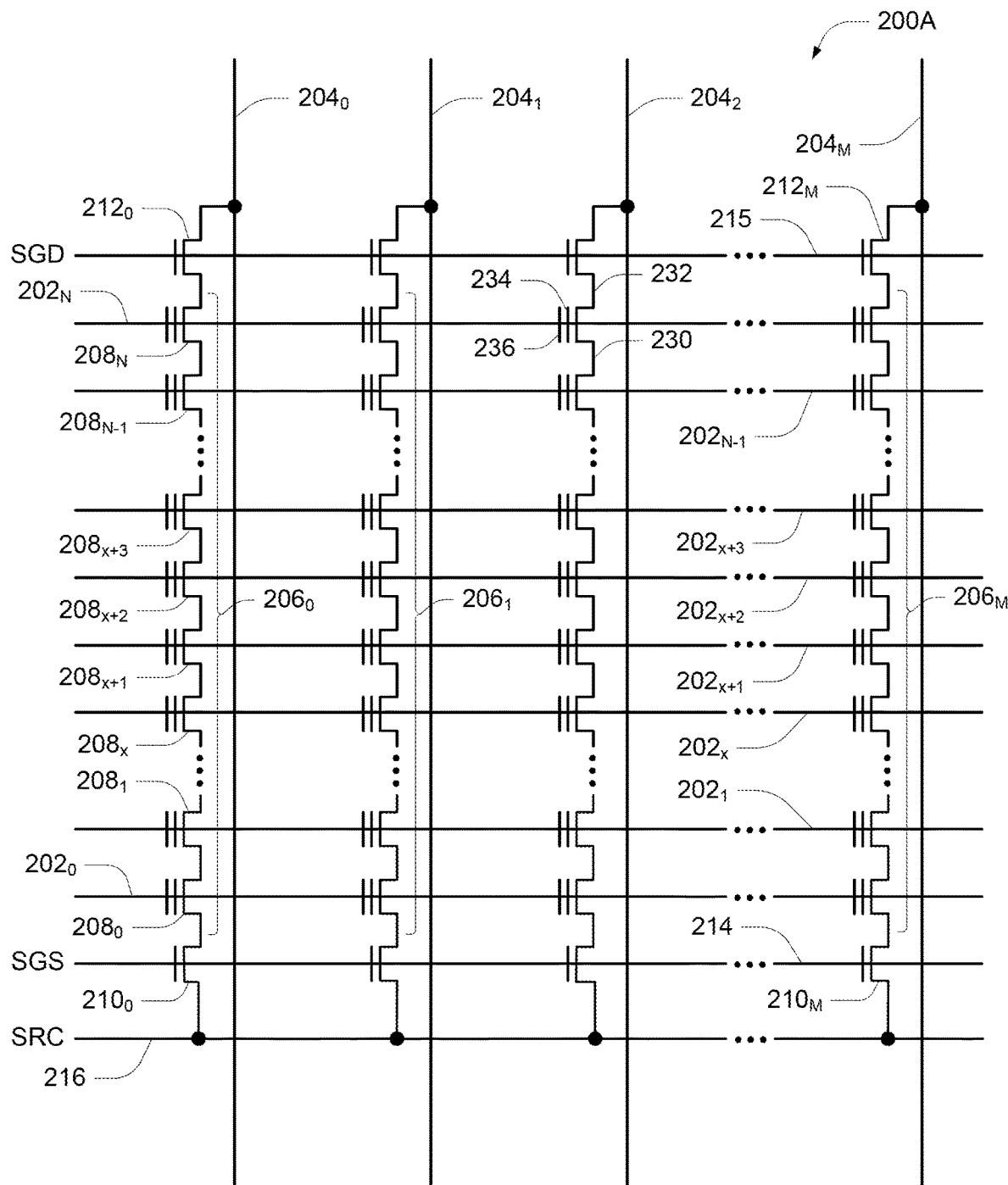
FIGS. 2A-2C are schematics of portions of an array of memory cells as could be used in a memory of the type described with reference to FIG. 1.

FIG. 2A is a schematic of a portion of an array of memory cells 200A as could be used in a memory of the type described with reference to FIG. 1, e.g., as a portion of array of memory cells 104. Memory array 200A includes access lines, such as word lines $202_0$ to $202_N$, and a data line, such as bit line 204. The word lines 202 may be connected to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-connected memory cells (e.g., non-volatile memory cells), such as one of NAND strings $206_0$ to $206_M$. Each NAND string 206 might be connected (e.g., selectively connected) to a common source 216 (SRC) and might include memory cells $208_0$ to $208_N$. The memory cells 208 may represent non-volatile memory cells for storage of data. The memory cells 208 of each NAND string 206 might be connected in series between a select gate 210 (e.g., a field-effect transistor), such as one of the select gates $210_0$ to $210_M$ (e.g., that may be source select transistors, commonly referred to as select gate source), and a select gate 212 (e.g., a field-effect transistor), such as one of the select gates $212_0$ to $212_M$ (e.g., that may be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 may utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the bit line 204 for the corresponding NAND string 206. For example, the drain of select gate $212_0$ might be connected to the bit line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the common bit line 204. A control gate of each select gate 212 might be connected to select line 215.

The memory array in FIG. 2A might be a three-dimensional memory array, e.g., where NAND strings 206 may extend substantially perpendicular to a plane containing the common source 216 and to a plane containing a plurality of bit lines 204 that may be substantially parallel to the plane containing the common source 216.

Typical construction of memory cells 208 includes a data-storage structure 234 (e.g., a floating gate, charge trap, etc.) that can determine a data state of the memory cell (e.g., through changes in threshold voltage), and a control gate 236, as shown in FIG. 2A. The data-storage structure 234 may include both conductive and/or dielectric structures while the control gate 236 is generally formed of one or more conductive materials. In some cases, memory cells 208 may further have a defined source/drain (e.g., source) 230 and a defined source/drain (e.g., drain) 232. Memory cells 208 have their control gates 236 connected to (and in some cases form) a word line 202.

A column of the memory cells 208 may be a NAND string 206 or a plurality of NAND strings 206 selectively connected to a given bit line 204. A row of the memory cells 208 may be memory cells 208 commonly connected to a given word line 202. A row of memory cells 208 can, but need not, include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) may be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) may be another physical page of memory cells 208 (e.g., odd memory cells). Although bit lines $204_3$-$204_5$ are not explicitly depicted in FIG. 2A, it is apparent from the figure that the bit lines 204 of the array of memory cells 200A may be numbered consecutively from bit line $204_0$ to bit line $204_M$. Other groupings of memory cells 208 commonly connected to a given word line 202 may also define a physical page of memory cells 208. For certain memory devices, all memory cells commonly connected to a given word line might be deemed a physical page of memory cells. The portion of a physical page of memory cells (which, in some embodiments, could still be the entire row) that is read during a single read operation or programmed during a single programming operation (e.g., an upper or lower page of memory cells for MLC memory) might be deemed a logical page of memory cells. A block of memory cells may include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells.

Figure 2B:
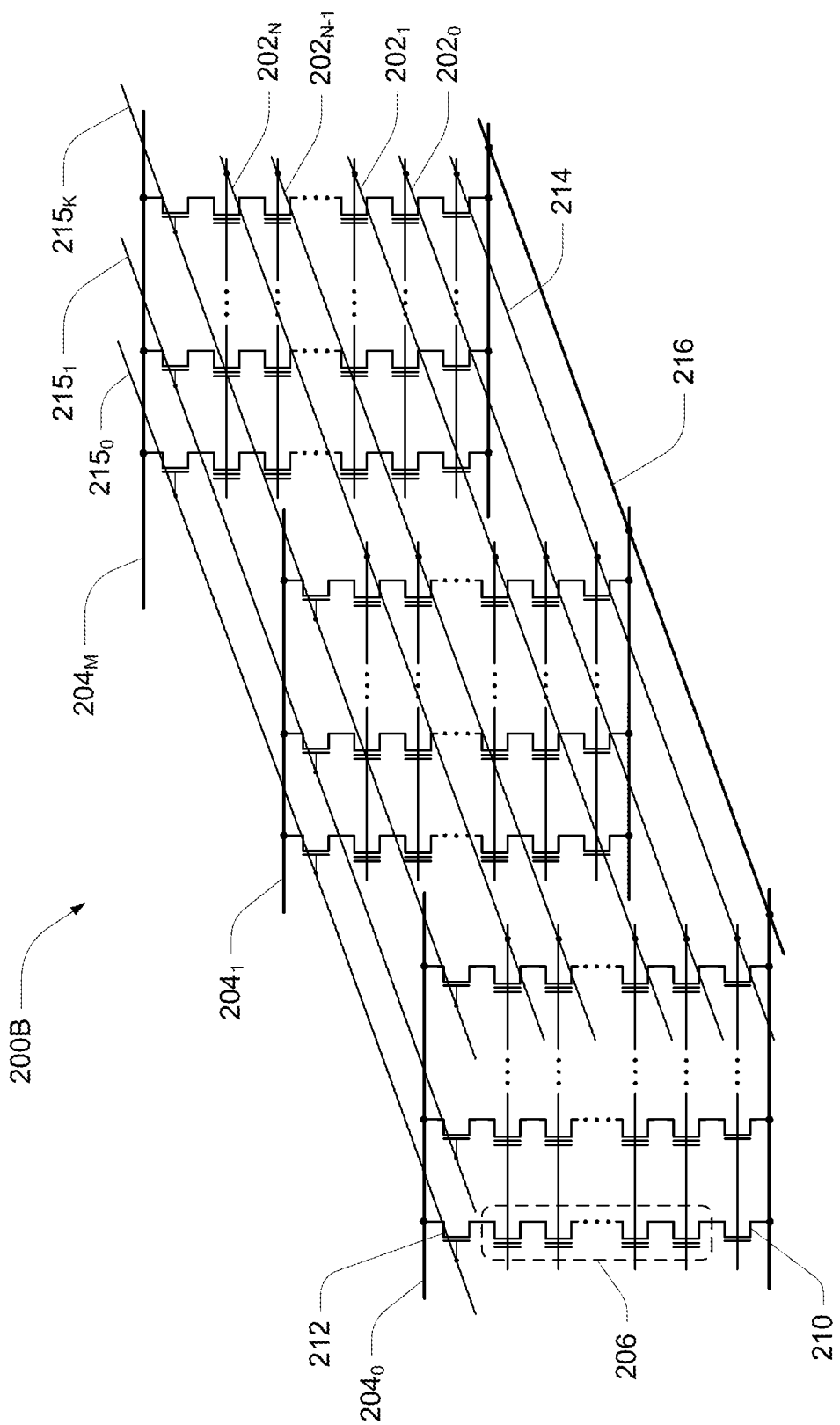

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B may incorporate vertical structures which may include semiconductor pillars where a portion of a pillar may act as a channel region of the memory cells of NAND strings 206. The NAND strings 206 may be each selectively connected to a bit line $204_0$-$204_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_K$ to selectively activate particular select transistors 212 each between a NAND string 206 and a bit line 204. The select transistors 210 can be activated by biasing the select line 214. Each word line 202 may be connected to multiple rows of memory cells of the memory array 200B. Rows of memory cells that are commonly connected to each other by a particular word line 202 may collectively be referred to as tiers.

Figure 2C:
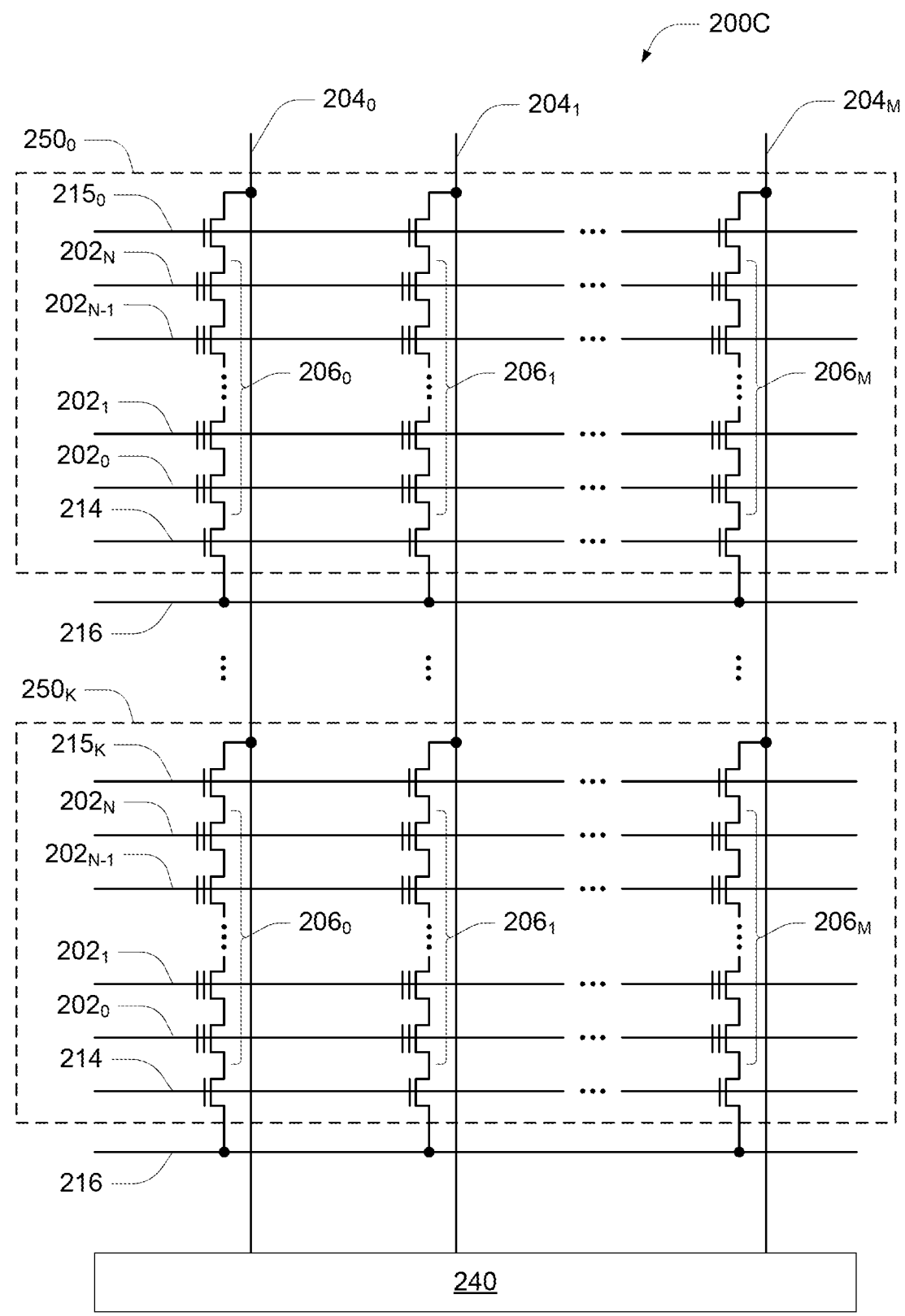

FIG. 2C is a further schematic of a portion of an array of memory cells 200C as could be used in a memory of the type described with reference to FIG. 1, e.g., as a portion of array of memory cells 104. Like numbered elements in FIG. 2C correspond to the description as provided with respect to FIG. 2A. Array of memory cells 200C may include strings of series-connected memory cells (e.g., NAND strings) 206, access (e.g., word) lines 202, data (e.g., bit) lines 204, select lines 214 (e.g., source select lines), select lines 215 (e.g., drain select lines) and source 216 as depicted in FIG. 2A. The array of memory cells 200A may be a portion of the array of memory cells 200C, for example. FIG. 2C depicts groupings of NAND strings 206 into blocks of memory cells 250. Blocks of memory cells 250 may be groupings of memory cells 208 that may be erased together in a single erase operation, sometimes referred to as erase blocks. Each block of memory cells 250 might represent those NAND strings 206 commonly associated with a single select line 215, e.g., select line $215_0$. The source 216 for the block of memory cells 2500 might be a same source as the source 216 for the block of memory cells 250K. For example, each block of memory cells 2500-250K might be commonly selectively connected to the source 216. A set of blocks of memory cells 250, e.g., two or more blocks of memory cells 250, commonly sharing (e.g., commonly selectively connected to) a set of data lines 204, e.g., data lines $204_0$-$204_M$, and commonly sharing (e.g., commonly selectively connected to) a source 216 might be referred to as a memory plane.

The data lines $204_0$-$204_M$ may be connected (e.g., selectively connected) to a buffer portion 240, which might be a portion of a page buffer of the memory. The buffer portion 240 might correspond to a memory plane (e.g., the set of blocks of memory cells 2500-250K). The buffer portion 240 might include sensing devices (not shown) for sensing data values indicated on respective data lines 204, and corresponding registers (not shown) for storage of the sensed data values from its corresponding memory plane.

Figure 3A:
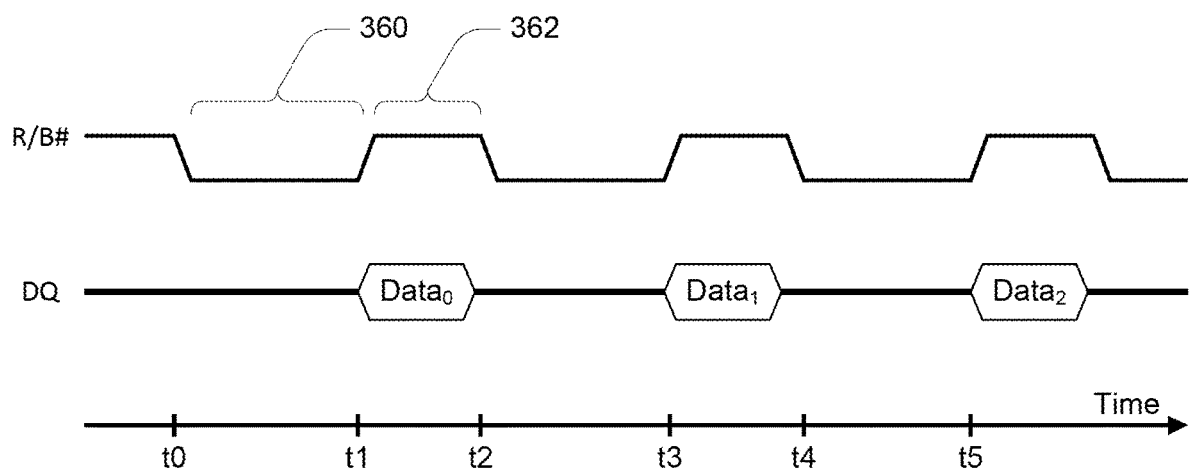
FIG. 3A is a timing diagram for reading data from different addresses of a memory according to background art.

FIG. 3A is a timing diagram for reading data from different addresses of a memory according to background art. Prior to time t0, the memory might receive a first command (not shown) to read data (e.g., $Data_0$) associated with a first address. For example, the command might have a format such as 00h-$Address_0$-20h, where 00h might be a command code indicating a desire to perform a read operation on the memory, $Address_0$ might be an address (e.g., logical or physical) corresponding to a storage location of the memory (e.g., within its array of memory cells), and 20h might be a command confirm code indicating to the memory that the command is complete, and the operation may begin.

Generally, before the memory can begin a read operation, certain activities may take place to prepare the memory for the read operation. The time required to perform such activities might be referred to as startup overhead. As a couple examples, voltage generation devices (e.g., charge pumps) might be activated to generate voltage levels required by the read operation, and a temperature of the memory might be sensed to adjust any temperature-dependent variables for the read operation. As the memory begins a read operation at time t0 in response to the first command, it might pull down the ready/busy control signal R/B #, indicating that it is busy performing an access operation or otherwise unavailable for additional commands. Upon completing the read operation at time t1, the memory might release the ready/busy control signal R/B # and provide the corresponding $Data_0$ to the D/Q lines (e.g., the lines of I/O bus 134). The memory might then perform certain activities to return the memory to some initialization state (i.e., some state from which to begin a next access operation). The time required to perform such activities might be referred to as closing overhead. As a couple examples, the voltage generation devices and analog circuitry of a controller (e.g., internal controller) performing the read operation might be deactivated. The period of time 360 thus might represent a period of time for actively performing the read operation and the period of time 362 might represent a period of time for readout of the $Data_0$ (e.g., by an external processor or other host device), preparing the memory for a subsequent operation, receipt of a next command, and startup overhead in response to that next command.

At time t2, in response to a second command (e.g., 00h-$Address_1$-20h) indicating a desire to read $Data_1$ corresponding to the location of $Address_1$, the memory might begin a second read operation, and might again pull down the ready/busy control signal R/B # for the duration of the second read operation. At time t3, the ready/busy control signal R/B # might be released, and the corresponding $Data_1$ might be provided to the D/Q lines.

At time t4, in response to a third command (e.g., 00h-$Address_2$-20h) indicating a desire to read $Data_2$ corresponding to the location of $Address_2$, the memory might begin a third read operation, and might again pull down the ready/busy control signal R/B # for the duration of the third read operation. At time t5, the ready/busy control signal R/B # might be released, and the corresponding $Data_2$ might be provided to the D/Q lines.

Figure 3B:
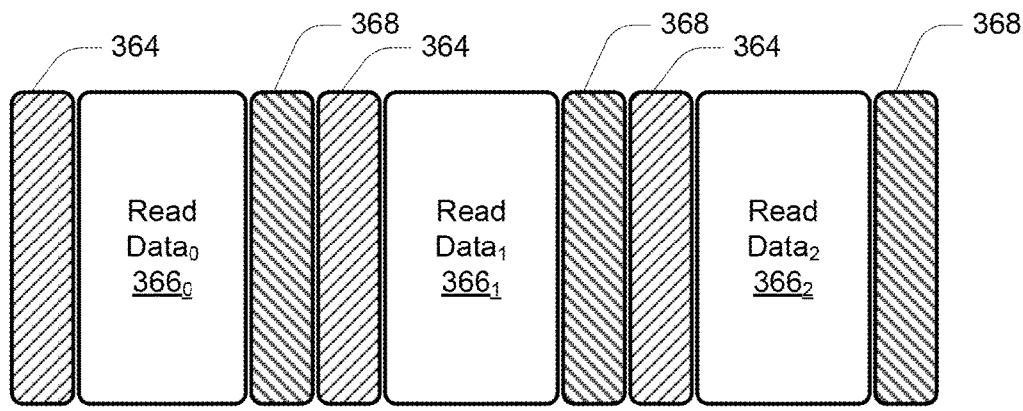
FIG. 3B depicts a conceptualization of certain events associated with reading the data in FIG. 3A.

FIG. 3B depicts a conceptualization of certain events associated with reading the data in FIG. 3A. For example, blocks 364 might represent time for performing startup overhead for each of the read operations of FIG. 3A, blocks 366 might represent time for performing the respective read operations of FIG. 3A, and blocks 368 might represent time for performing closing overhead for each of the read operations of FIG. 3A.

In contrast to the type of read operation discussed with reference to FIGS. 3A-3B, various embodiments may provide for reading data from multiple addressed locations of the memory without performing closing overhead activities or startup overhead activities between read operations.

Figure 4A:
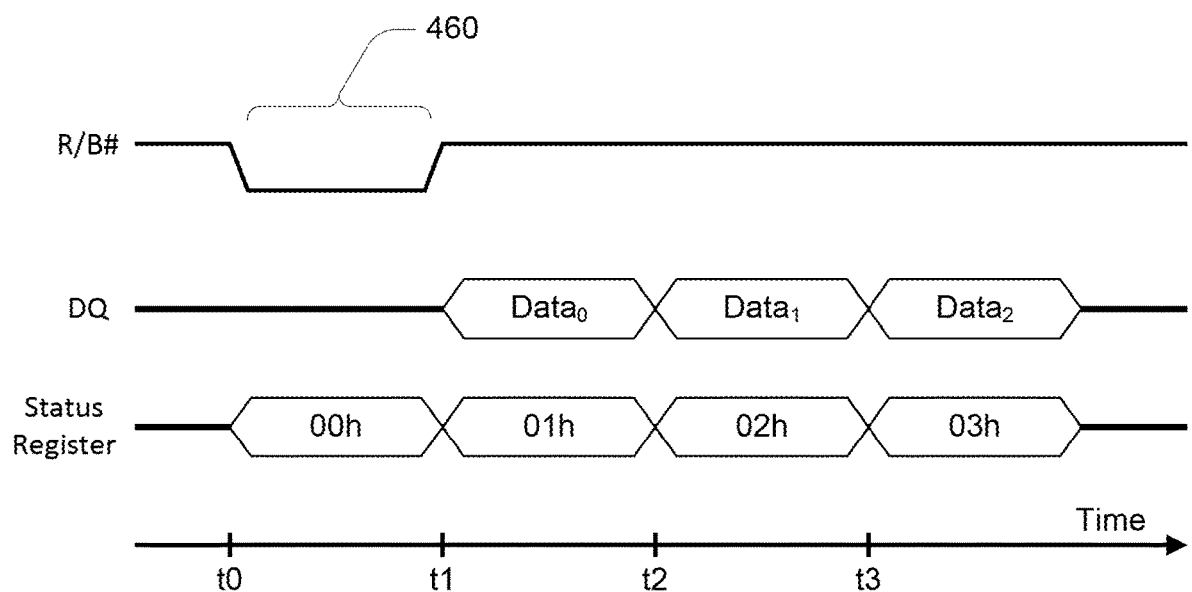
FIG. 4A is a timing diagram for reading data from different addresses of a memory according to an embodiment.

FIG. 4A is a timing diagram for reading data from different addresses of a memory according to an embodiment. Prior to time t0, the memory might receive a first command (not shown) to read data associated with one or more addresses. For example, the command might have a format such as xxh-$Address_0$, $Address_1$, ... $Address_{N-1}$-yyh, where xxh might be a command code indicating a desire to perform a read operation on the memory in accordance with an embodiment, $Address_0$-$Address_{N-1}$ might be addresses (e.g., logical or physical) corresponding to storage locations of the memory (e.g., within its array of memory cells), and yyh might be a command confirm code indicating to the memory that the command is complete, and the operation may begin. For the discussion of FIG. 4A, the example command might take the form, xxh-$Address_0$, $Address_1$, $Address_2$-yyh, i.e., a command associated with three addresses, e.g., N=3. While this example utilizes three addresses associated with the command, other numbers of addresses can also be used with various embodiments.

As the memory begins a read operation at time t0 in response to the command, it might provide an indication that it is busy performing an access operation or otherwise unavailable for additional commands, e.g., by pulling down the ready/busy control signal R/B #. For some embodiments, the memory might store a value (e.g., 00h in the depicted example) in a status register indicating that no data associated with the read command is available (e.g., is yet available) for readout.

Upon completing the read operation at time t1, the memory might provide an indication that it is available to receive additional commands, e.g., the memory might release the ready/busy control signal R/B #. The memory might further provide the corresponding $Data_0$ to the D/Q lines (e.g., the lines of I/O bus 134) at time t1. In conjunction, the memory might store a value (e.g., 01h in the depicted example) in the status register to indicate that the data (e.g., $Data_0$) associated with a particular (e.g., first) address (e.g., $Address_0$) of the command is available for readout. While the memory might perform startup overhead activities before starting the read operation, closing overhead activities might be eliminated, such that the memory can begin performing a next (e.g., second) read operation at time t1 to read the data (e.g., Data') associated with the next address (e.g., $Address_1$) of the command. In addition, by eliminating the closing overhead activities, the second read operation can begin without performing startup overhead activities for that read operation. For example, the memory might begin the next read operation in response to latching the data values into the page buffer.

Because embodiments can begin a next read operation without confirmation that the data has been read out, the external device (e.g., external processor) might be configured to periodically read the status register to determine when, and which, data is available. The timing of performing the readout is generally of little concern as time required for readout of data by an external device is typically small compared to the time required to read the data internally, possibly by an order of magnitude. For example, it might take less than 5 μs for readout of data by an external device, while it might take more than 50 μs before the memory could provide the next data for output, thus providing a significant margin before data might be overwritten.

While performing the second read operation beginning at time t1, the memory might not pull down the ready/busy control signal R/B # as shown with respect to the first read operation, e.g., instead continuing to indicate that it is available to receive additional commands. This might allow an external device to cancel the read operation or perform other activities, such as reading the status register or entering additional addresses to be read. Upon completing the second read operation at time t2, the memory might provide the corresponding $Data_1$ to the D/Q lines. In conjunction, the memory might store a value (e.g., 02h in the depicted example) in the status register to indicate that the data (e.g., $Data_1$) associated with a particular (e.g., second) address (e.g., $Address_1$) of the command is available for readout. Again, the next (e.g., third) read operation can begin without performing closing overhead activities or startup overhead activities. As such, the memory can begin performing a next (e.g., third) read operation at time t2 to read the data (e.g., $Data_2$) associated with the next (e.g., third) address (e.g., $Address_2$) of the command.

Upon completing the third read operation at time t3, the memory might provide the corresponding $Data_2$ to the D/Q lines. In conjunction, the memory might store a value (e.g., 03h in the depicted example) in the status register to indicate that the data (e.g., $Data_2$) associated with a particular (e.g., third) address (e.g., $Address_2$) of the command is available for readout.

Figure 4B:
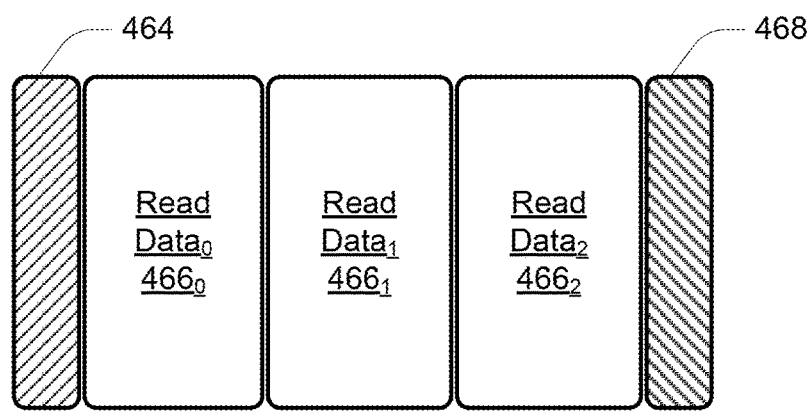
FIG. 4B depicts a conceptualization of certain events associated with reading the data in FIG. 4A.

FIG. 4B depicts a conceptualization of certain events associated with reading the data in FIG. 4A. For example, block 464 might represent time for performing startup overhead (e.g., once per command), blocks 466 might represent time for performing the respective read operations of FIG. 4A (e.g., one for each associated address), and block 468 might represent time for performing closing overhead (e.g., once per command).

It is noted that the addresses associated with the read command might be addresses to contiguous address space. However, the addresses associated with a read command in accordance with embodiments might not be contiguous. For example, a memory might be configured to store more than one digit of data in a memory cell by assigning different threshold voltage ranges to different patterns of digits. MLC memory might use four threshold voltage ranges to represent a bit pattern of two bits, including a first digit, e.g., a least significant bit (LSB) or lower page (LP) data; and a second digit, e.g., a most significant bit (MSB) or upper page (UP) data. Similarly, TLC memory might use eight threshold voltage ranges to represent a bit pattern of three bits, including a first digit, e.g., a least significant bit (LSB) or lower page (LP) data; a second digit, e.g., upper page (UP) data; and a third digit, e.g., a most significant bit (MSB) or extra page (XP) data. Addresses associated with the read command might all correspond to a particular type of data page, e.g., all lower page data, or they may include more than one type of data page, e.g., some combination of lower page data, upper page data and/or extra page data. In addition, addresses associated with the read command might all correspond to addresses of a single block of memory cells, or they may correspond to addresses of more than one block of memory cells, of more than one memory plane, etc.

From the foregoing description, it should be apparent that such a method of operating a memory is distinguished from prior art read operations that might output data corresponding to multiple addresses. For example, synchronous DRAM commonly utilizes burst reads, where a read operation might begin with a starting address, and additional read operations might proceed by incrementing the starting or prior address. However, such read operations rely on providing first data after a known latency, and providing successive data on successive clock cycles. In particular, the host device knows when to expect the first data to appear on the DQ lines, and knows to expect new data to appear on each subsequent clock cycle. Such a scheme is generally unavailable to non-volatile memory because the access times are typically too long, and may vary depending upon the data values of the memory cells to be read, or the number of data states stored to those memory cells, e.g., MLC or TLC. Such schemes are also generally confined to contiguous address space. Similarly, while read operations of non-contiguous address space in non-volatile memory may be known, they may rely on handshaking between the memory and its host so the memory knows when it can begin reading data corresponding to a subsequent address without overwriting data that has not been read out.

To provide for the method of operating a memory such as described with reference to FIGS. 4A-4B, the status register may include registers to indicate whether data is available, and, when data is available, to indicate which data is available. As is common, a status register might include additional registers for other information that might be relevant to a host device. Table 1 represents one implementation, according to an embodiment, to provide indications according to embodiments.

Consider the example where the read command could include 16 addresses, e.g., $Address_0$-$Address_{15}$. A five-digit (e.g., five-bit) register could be utilized to provide the various indications for 16 addresses and a no-data indication. Table 1 might represent data values of individual one-digit (e.g., one-bit) registers of a five-digit register, e.g., as a portion of a larger status register. For example, the value "00000" might be used to indicate that no data is available, e.g., that any data on the DQ lines is invalid, the value "00001" might indicate that the data corresponding to $Address_0$ is available, the value "00010" might indicate that the data corresponding to $Address_1$ is available, the value "00011" might indicate that the data corresponding to $Address_2$ is available, and so on.

TABLE 1

| | | | | | |
|---|---|---|---|---|---|
| No Data | 0 | 0 | 0 | 0 | 0 |
| $Address_0$ | 0 | 0 | 0 | 0 | 1 |
| $Address_1$ | 0 | 0 | 0 | 1 | 0 |
| $Address_2$ | 0 | 0 | 0 | 1 | 1 |
| $Address_3$ | 0 | 0 | 1 | 0 | 0 |
| $Address_4$ | 0 | 0 | 1 | 0 | 1 |

TABLE 1-continued

| | | | | | |
|---|---|---|---|---|---|
| $Address_5$ | 0 | 0 | 1 | 1 | 0 |
| $Address_6$ | 0 | 0 | 1 | 1 | 1 |
| $Address_7$ | 0 | 1 | 0 | 0 | 0 |
| $Address_8$ | 0 | 1 | 0 | 0 | 1 |
| $Address_9$ | 0 | 1 | 0 | 1 | 0 |
| $Address_{10}$ | 0 | 1 | 0 | 1 | 1 |
| $Address_{11}$ | 0 | 1 | 1 | 0 | 0 |
| $Address_{12}$ | 0 | 1 | 1 | 0 | 1 |
| $Address_{13}$ | 0 | 1 | 1 | 1 | 0 |
| $Address_{14}$ | 0 | 1 | 1 | 1 | 1 |
| $Address_{15}$ | 1 | 0 | 0 | 0 | 0 |

Table 2 might represent data values of individual one-digit (e.g., one-bit) registers of a five-digit (five-bit) register in an alternative implementation. In this example, one register might be used as a flag bit. For example, this register might store a logical 1 to provide the no-data indication, and a logical 0 to provide an indication that data is valid. For example, the value "1XXXX" might be used to indicate that no data is available, e.g., that any data on the DQ lines is invalid. The value X might indicate a don't-care value for a register. Because the flag bit can indicate the data is invalid, the values of the remaining registers become moot. It is noted that while a logical 1 is used in this example to provide the no-data indication, a logical 0 could alternatively be used.

TABLE 2

| | | | | | |
|---|---|---|---|---|---|
| No Data | 1 | X | X | X | X |
| $Address_0$ | 0 | 0 | 0 | 0 | 0 |
| $Address_1$ | 0 | 0 | 0 | 0 | 1 |
| $Address_2$ | 0 | 0 | 0 | 1 | 0 |
| $Address_3$ | 0 | 0 | 0 | 1 | 1 |
| $Address_4$ | 0 | 0 | 1 | 0 | 0 |
| $Address_5$ | 0 | 0 | 1 | 0 | 1 |
| $Address_6$ | 0 | 0 | 1 | 1 | 0 |
| $Address_7$ | 0 | 0 | 1 | 1 | 1 |
| $Address_8$ | 0 | 1 | 0 | 0 | 0 |
| $Address_9$ | 0 | 1 | 0 | 0 | 1 |
| $Address_{10}$ | 0 | 1 | 0 | 1 | 0 |
| $Address_{11}$ | 0 | 1 | 0 | 1 | 1 |
| $Address_{12}$ | 0 | 1 | 1 | 0 | 0 |
| $Address_{13}$ | 0 | 1 | 1 | 0 | 1 |
| $Address_{14}$ | 0 | 1 | 1 | 1 | 0 |
| $Address_{15}$ | 0 | 1 | 1 | 1 | 1 |

To continue with this example of Table 2, the value "00000" might then indicate that the data corresponding to $Address_0$ is available, the value "00001" might indicate that the data corresponding to Address' is available, the value "00010" might indicate that the data corresponding to $Address_2$ is available, and so on. Other schemes for providing relevant indications might also be used.

Figure 5:
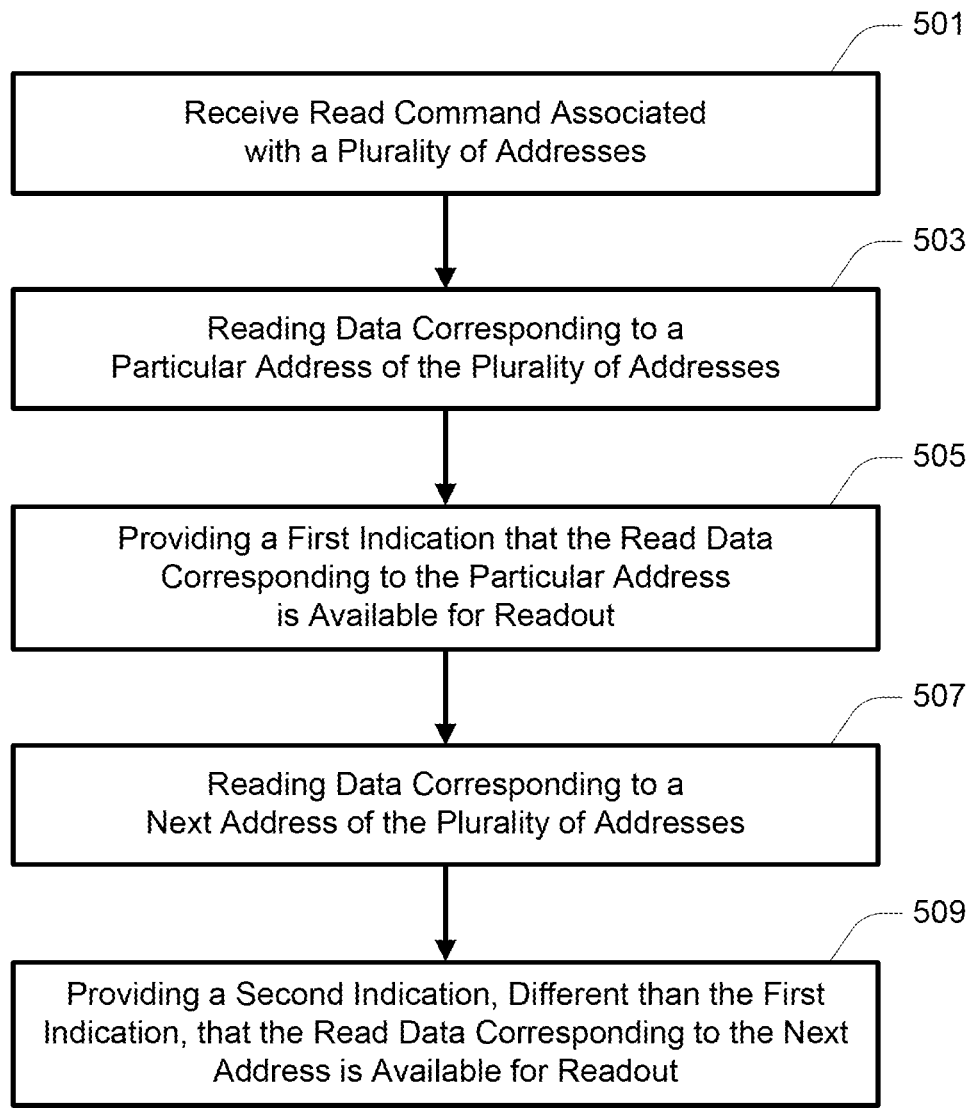
FIG. 5 is a flowchart of a method of operating a memory according to an embodiment.

FIG. 5 is a flowchart of a method of operating a memory according to an embodiment. At 501, a read command might be received by the memory from an external device, such as a memory controller or other processor. The read command might be associated with a plurality of addresses.

At 503, the memory might read data corresponding to a particular address of the plurality of addresses, e.g., in response to the read command. At 505, the memory might provide an indication (e.g., first indication) that the read data corresponding to the particular address is available for readout. For example, the memory might change a value of a status register to indicate that that the read data corresponding to the particular address is available for readout.

At 507, the memory might read data corresponding to a next address of the plurality of addresses, e.g., in response to the read command. For example, the next address might be an address in a sequence of the received plurality of addresses that was received subsequent to (e.g., immediately subsequent to) receiving the particular address. Alternatively, the next address might be an address in a sequence of the received plurality of addresses that was received prior to (e.g., immediately prior to) receiving the particular address. Other orders of addresses are likewise feasible. At 509, the memory might provide an indication (e.g., second indication) that the read data corresponding to the next address is available for readout. For example, the memory might change a value of a status register to indicate that that the read data corresponding to the next address is available for readout. The indication that that the read data corresponding to the next address is available for readout is different (e.g., has a different value) than the indication that that the read data corresponding to the particular address is available for readout. By providing a different indication, the memory can indicate not only that data is available for readout, but which data is available for readout.

Figure 6:
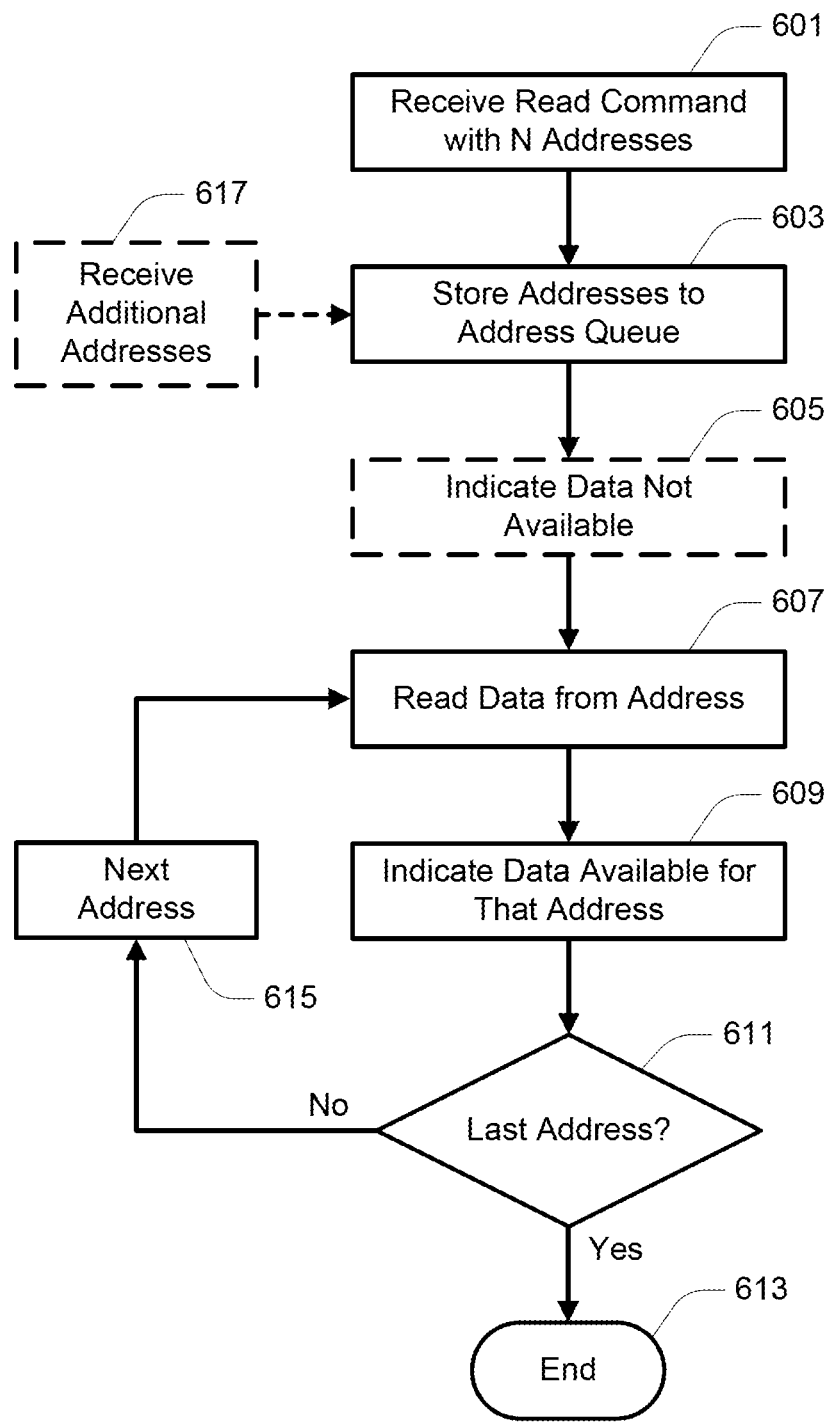
FIG. 6 is a flowchart of a method of operating a memory according to another embodiment.

FIG. 6 is a flowchart of a method of operating a memory according to an embodiment. At 601, a read command might be received with N addresses from an external device, such as a memory controller or other processor. N might be any integer value greater than one.

At 603, the received addresses might be stored to an address queue of the memory. Address queues according to various embodiments will be described with reference to FIG. 7. At 605, the memory might optionally indicate that data associated with the read command is not yet available. For example, a value can be stored to a status register that is available for readout by the external device.

At 607, the memory might read the data from a storage location or locations corresponding to a particular address of the N addresses. For example, where the N addresses correspond to the addresses $Address_0$-$Address_{N-1}$ in an order of receipt, the particular address might correspond to the first received address $Address_0$. Alternatively, the particular address might correspond to the last received address $Address_{N-1}$. Where the memory performs logical to physical translation, the received addresses might represent logical addresses, and the storage location or locations corresponding to a particular logical address might correspond to a physical storage location or physical storage locations determined by the memory upon translation. Where the memory does not perform logical to physical translation, the received addresses might represent physical addresses corresponding to a physical storage location or locations of the memory.

At 609, after reading the data, an indication is provided that the data is available for readout. As discussed, this could be a particular value of a register, e.g., a portion of a status register, that is available for readout by the external device. The indication may further indicate to which address of the received addresses the available data corresponds. At 611, the memory may then determine if the address corresponding to the read data is a last address of the received addresses, e.g., the memory might determine if data corresponding to each received address has been read. If yes, the method might end at 613. If no, a next address might be determined at 615. To continue the example, where the original address was $Address_0$, the next address might be $Address_1$. Similarly, where the original address was $Address_{N-1}$, the next address might be $Address_{N-2}$. The process might then return to 607 to read the data corresponding to the next address. This process can they repeat for each subsequent address of the received addresses.

For some embodiments, additional addresses might be received at 617 during the operations responsive to the read command. These additional addresses might be also stored to the address queue at 603.

Figure 7:
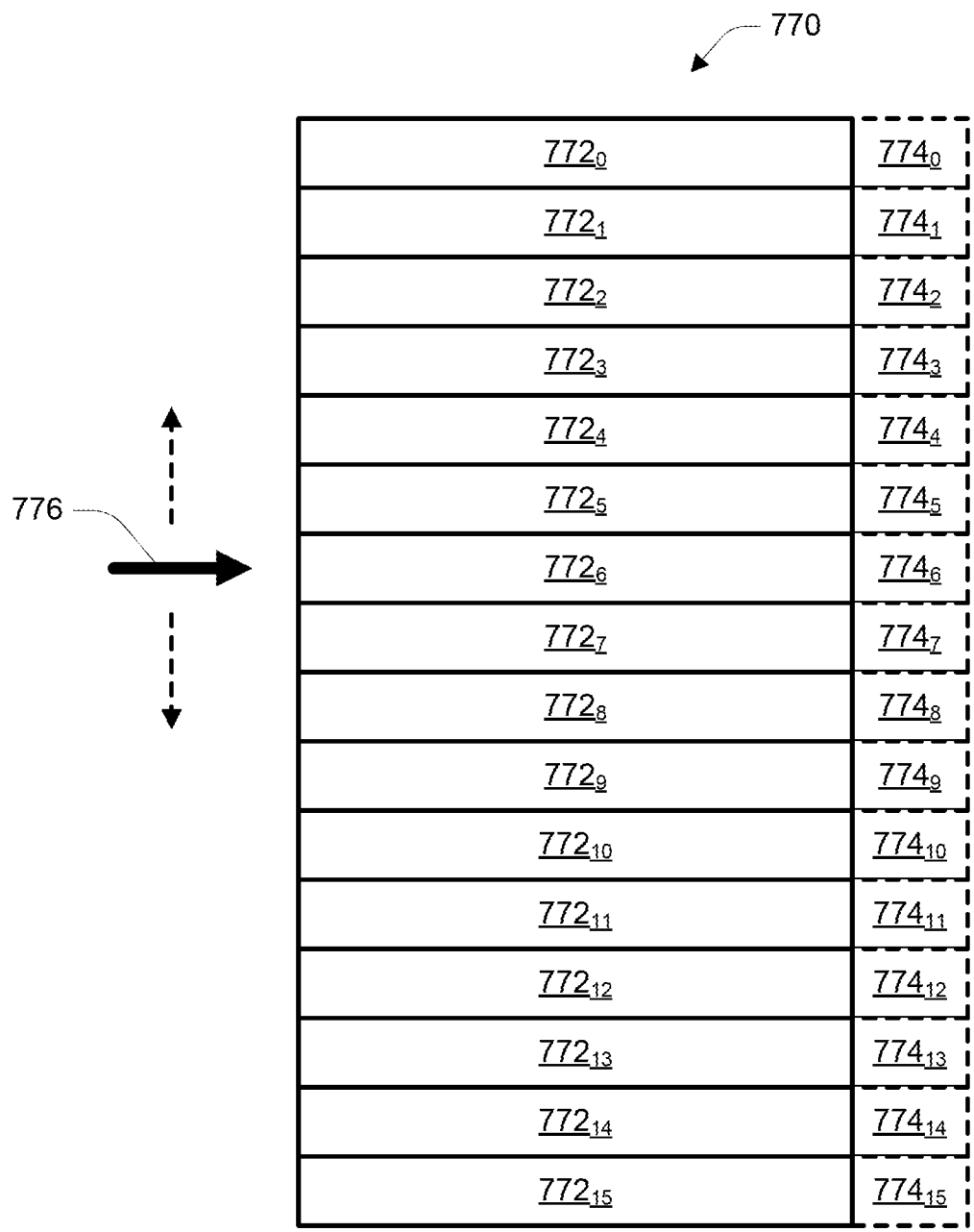
FIG. 7 depicts a structure of an address queue according to embodiments.

FIG. 7 depicts a structure of an address queue 770 according to embodiments. The address queue 770 might include a number of address registers 772 (e.g., address registers $772_0$-$772_{15}$) corresponding to a number (e.g., a maximum number) of addresses to be received with a read command. The address queue 770 might correspond to an embodiment configured to store 16 addresses received with a read command. Other numbers of address registers 772 may be used.

As addresses are received with a read command according to an embodiment, those received addresses might be stored to individual address registers 772 in sequence. The arrow 776 might conceptually correspond to an address pointer indicating to which address register 772 an address should be stored, and/or indicating which address register 772 corresponds to an address to use for performing a read operation, e.g., a next or current read operation. The address pointer 776 might be incremented, or decremented, to indicate a next address register 772 when an address is received, and/or when a next read operation is to be performed for the received addresses. As one example, the address pointer 776 might be a counter. For example, a four-digit (e.g., four-bit) counter might be used to sequentially proceed through the example sixteen address registers 772.

For embodiments permitting the receipt of additional addresses, the counter might be a wrap-around counter, e.g., upon reaching a "1111" value, the counter might return to "0000" for a next count. In this manner, additional addresses could be entered after reading data corresponding to initially-received addresses, and address registers 772 corresponding to those read addresses might be used to store the newly-received addresses. As an example, consider the receipt of 16 addresses, with their storage to address registers $772_0$-$772_{15}$. After reading data corresponding to address registers $772_0$-$772_7$, eight additional addresses might be received and stored to address registers $772_0$-$772_7$ while the memory proceeds with reading data corresponding to address registers $772_8$-$772_{15}$. Using a wrap-around counter, upon reading data corresponding to address register $772_{15}$, the count could return to 0 to read data corresponding to the new address in address register $772_0$.

To assist in determining whether to cycle through at least a portion of the address registers $772_0$-$772_{15}$ again, an additional set of flag registers 774 (e.g., flag registers $774_0$-$774_{15}$) might optionally be included. These flag registers 774 might be one-digit (e.g., one-bit) registers for storing a flag bit indicating whether its corresponding address register 772 contains a valid address. A flag register 774 could be set to an initial value (e.g., logical 1) indicating that its corresponding address register 772 does not contain a valid address. As addresses are received, the value of the flag registers 774 might be correspondingly toggled to a different value (e.g., logical 0) to indicate that the corresponding address registers 772 contain valid addresses.

As a read operation for an address of an address register 772 is performed (e.g., has been completed or, perhaps, initiated), the corresponding flag register 774 might be toggled back to its initial value. As such, upon returning to the address register $772_0$, the flag register $774_0$ could be used to indicate whether the address register $772_0$ contains a valid address for a next read operation, or whether the address register $772_{15}$ contained the last address for the read command. Additionally, where the read command might support some number of associated addresses, such flag registers 774 could be used to indicate when some lesser number of associated addresses are received with the command. In the example of FIG. 7, if a read command were received with fewer than the 16 addresses possible in this example, the address registers 772 not receiving an address could have corresponding flag registers 774 indicating that there is no valid address in those address registers 772, thus facilitating determining whether a last address has been reached. As an alternative to flag registers 774, a value could be stored in the address registers 772 indicating that no valid address is stored, such as a value that would not correspond to any valid address within the memory. For example, a value of all logical 0s within an address register might indicate that no address is stored in the address register 772 if a value of all logical 0s would not address any valid storage location of the memory.

Figure 8:
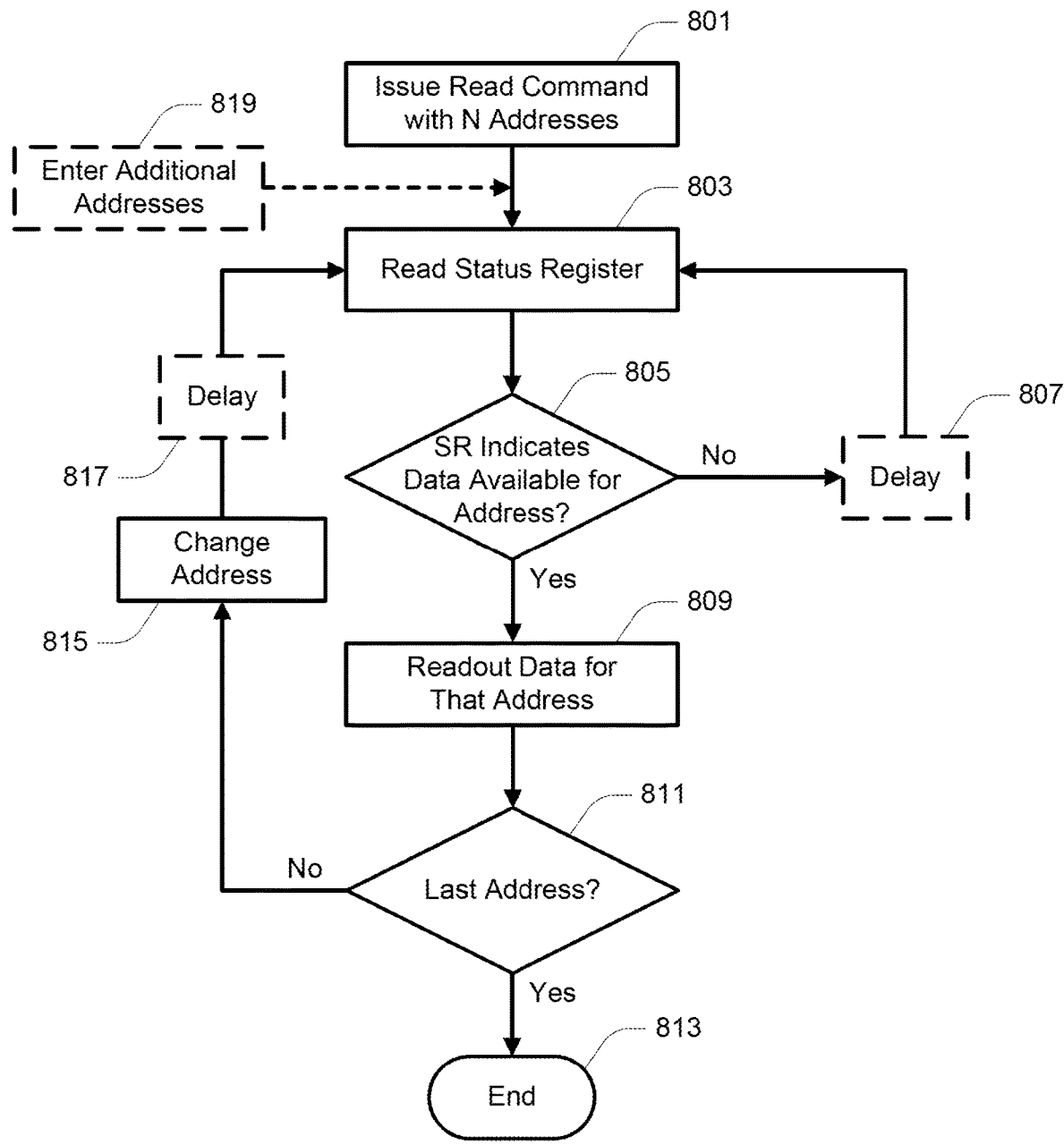
FIG. 8 is a flowchart of a method of operating a system containing a memory according to an embodiment.

FIG. 8 is a flowchart of a method of operating a system containing a memory according to an embodiment. At 801, a controller of the system might issue a read command to a memory of the system, where the read command is associated with N addresses. N might be any integer value greater than one.

After issuing the read command and its associated addresses, the controller might read a status register of the memory at 803. If the status register does not indicate that data is available for a particular address at 805, the controller might read the status register again at 803. As noted earlier, the time for readout of data from the memory is typically much shorter than the time required by the memory to read the data from its storage location. As such, a delay might be introduced at 807 before reading the status register again at 803. For example, if it were known that the memory takes at least 50 µs to perform a read operation and present new data for readout, and a time needed for readout of the data is less than 5 µs, a delay of less than 50 µs might be used before reading the status register again, e.g., a delay of 30 µs might be used while still providing margin to perform the readout before being overwritten with new data. A delay might also be introduced before reading the status register for the first time. Alternatively, the controller might read the status register in the first instance in response to the ready/busy control signal RB # transitioning, indicating that the memory completed the first read operation.

If the status register does indicate that data is available for the particular address at 805, the controller might perform a readout of the corresponding data for that address at 809. The controller might then determine if that address was the last address for the read command at 811. If yes, the method might end at 813. If no, the controller might change the address at 815 and return to read the status register at 803, with or without a delay 817. The process could be repeated for each remaining address associated with the read command.

Optionally, the controller might provide additional addresses to the memory at 819 while the memory is in the process of performing read operations in response to the read command. For example, the controller might provide additional addresses as discussed with reference to FIG. 7.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A memory, comprising:
an array of memory cells;
a status register; and
a controller configured to access the array of memory cells;
wherein the controller is further configured to:
sequentially perform a plurality of read operations on the array of memory cells in response to a read command associated with a plurality of addresses, each read operation of the plurality of read operations corresponding to a respective address of the plurality of addresses;
in response to data of a particular read operation of the plurality of read operations corresponding to a particular address of the plurality of addresses being available for readout by an external device, storing a particular value of a plurality of status values to the status register and initiating a different read operation of the plurality of read operations corresponding to a different address of the plurality of addresses; and
in response to data of the different read operation being available for readout by the external device, storing a different value of the plurality of status values to the status register;
wherein each address of the plurality of addresses corresponds to a respective value of the plurality of status values in a one-to-one relationship; and
wherein each value of the plurality of status values indicates that data available for readout by the external device corresponds only to its respective address of the plurality of addresses.

2. The memory of claim 1, wherein the controller is further configured to:
for each read operation of the plurality of read operations:
in response to data of that read operation being available for readout by the external device, storing a respective value of the plurality of status values to the status register indicating to which address of the plurality of addresses the available data corresponds.

3. The memory of claim 1, further comprising:
an address queue comprising a plurality of address registers;
wherein the controller is further configured to store each address of the plurality of addresses to a respective address register of the plurality of address registers.

4. The memory of claim 3, wherein the address queue further comprises a plurality of flag registers, each flag register of the plurality of flag registers corresponding to a respective address register of the plurality of address registers, and configured to indicate whether its respective address register contains a valid address.

5. The memory of claim 4, wherein the controller is further configured to store a particular value to each flag register of the plurality of flag registers when storing an address of the plurality of addresses to its respective address register of the plurality of address registers.

6. The memory of claim 5, wherein the controller is further configured to store a different value to each flag register of the plurality of flag registers in response to performing a read operation for the address stored in its respective address register of the plurality of address registers.

7. The memory of claim 1, wherein the controller is further configured to store an alternate status value to the status register, mutually exclusive of the plurality of status values, to indicate that no data of the plurality of read operations is available for readout by the external device.

8. A method of operating a memory, comprising:
receiving a read command associated with a plurality of addresses;
reading data corresponding to a particular address of the plurality of addresses while a ready/busy control signal of the memory has a first value, then transitioning the ready/busy control signal to have a second value different from the first value;
providing an indication that the read data corresponding to the particular address is available for readout;
after reading the data corresponding to the particular address, reading data corresponding to a next address of the plurality of addresses while the ready/busy control signal is maintained at the second value; and
providing an indication that the read data corresponding to the next address is available for readout;
wherein the indication that the read data corresponding to the particular address is available for readout is different than the indication that the read data corresponding to the next address is available for readout; and
wherein the ready/busy control signal is maintained at the second value from a time of transitioning the ready/busy control signal from the first value to the second value through a time of providing the indication that the read data corresponding to the next address is available for readout.

9. The method of claim 8, further comprising:
for each subsequent address of the plurality of addresses:
reading data corresponding to that address while the ready/busy control signal is maintained at the second value; and
providing an indication that the read data corresponding to that address is available for readout;
wherein a value of the indication that the read data corresponding to that address is available for readout is different than a value of the indication that the read data corresponding to any other address of the plurality of addresses is available for readout.

10. The method of claim 8, further comprising providing an indication that no valid data is available for readout prior to providing the indication that the read data corresponding to the particular address is available for readout, wherein a value of the indication that no valid data is available for readout is different than a value of the indication that the read data corresponding to any address of the plurality of addresses is available for readout.

11. The method of claim 8, further comprising:
reading the data corresponding to the next address of the plurality of addresses without performing closing or startup overhead activities after reading the data corresponding to the particular address of the plurality of addresses.

12. The method of claim 11, further comprising performing startup overhead activities in response to the read command before reading data corresponding to a first address of the plurality of addresses.

13. The method of claim 12, further comprising performing closing overhead activities in response to the read command after reading data corresponding to a last address of the plurality of addresses.

14. The method of claim 11, further comprising performing the startup overhead activities in response to the read command only before reading the data corresponding to the first address of the plurality of addresses.

15. The method of claim 11, further comprising performing the closing overhead activities in response to the read command only after reading the data corresponding to the last address of the plurality of addresses.

16. A method of operating a memory, comprising:
receiving a read command associated with N addresses, wherein N is an integer value greater than one;
storing the N addresses to a queue;
reading data corresponding to a particular address of a queue and making the data corresponding to the particular address available for readout;
providing an indication that the data corresponding to the particular address is available for readout;
after reading the data corresponding to the particular address and making the data corresponding to the particular address available for readout, reading data corresponding to a next address of the queue and making the data corresponding to the next address available for readout; and
providing an indication that the data corresponding to the next address is available for readout;
wherein the indication that the data corresponding to the particular address is available for readout is different than the indication that the data corresponding to the next address is available for readout; and
wherein making the data corresponding to the next address available for readout occurs autonomously within the memory after making the data corresponding to the particular address available for readout.

17. The method of claim 16, wherein storing the N addresses to the queue comprises storing the N addresses to a queue having a number of address registers greater than or equal to N.

18. The method of claim 17, further comprising:
storing each address of the N addresses to a corresponding address register of the queue; and
for each address register of the queue receiving an address of the N addresses, storing a particular value to a corresponding flag register of a plurality of flag registers.

19. The method of claim 18, wherein reading the data corresponding to the particular address of queue further comprises storing a different value to the flag register of the plurality of flag registers corresponding to the address register of the plurality of address registers storing the particular address.

20. The method of claim 18, further comprising:
storing an additional address to a particular address register of the plurality of address registers after reading data corresponding to the address of the plurality of addresses stored in the particular address register.

21. The method of claim 15, further comprising:
storing each address of the N addresses to a corresponding address register of the queue, wherein the queue comprises a number of address registers greater than N; and
storing a particular value to an address register of the queue that does not store an address of the N addresses, wherein the particular value does not correspond to any valid storage location of the memory.

22. An electronic system, comprising:
a processor; and
a memory in communication with the processor;
wherein the processor is configured to:
issue a read command to the memory, wherein the read command is associated with N addresses, and wherein N is an integer value greater than one;
read a status register of the memory until the status register indicates that data corresponding to a particular address of the N addresses is available for readout;
when the status register indicates that the data corresponding to the particular address is available for readout, read out that data from the memory;
determine a next address of the N addresses;
read the status register of the memory until the status register indicates that data corresponding to the next address is available for readout; and
when the status register indicates that the data corresponding to the next address is available for readout, read out that data from the memory; and
wherein the memory is configured to:
store a particular value to the status register to indicate that the data corresponding to the particular address is available for readout;
store a different value to the status register to indicate that the data corresponding to the next address is available for readout; and
overwrite the data corresponding to the particular address with the data corresponding to the next address without confirmation from the processor that the data corresponding to the particular address has been read out by the processor.

23. The electronic system of claim 22, wherein the processor is further configured to implement a delay after a particular instance of reading the status register and before an immediately subsequent instance of reading the status register.

24. The electronic system of claim 22, wherein the memory, for each address of the N addresses, is further configured to store a respective value to the status register to indicate that data corresponding to that address is available for readout, wherein the respective value corresponding to that address is different than the respective value corresponding to any remaining address of the N addresses.

25. The electronic system of claim 24, wherein the memory is further configured to store a value to the status register that is different than the respective value corresponding to any address of the N addresses when no valid data is available for readout.

26. The electronic system of claim 22, wherein the processor is further configured to provide an additional address to the memory before data corresponding to each address of the N addresses is available for readout.

* * * * *